(12) United States Patent
Peng et al.

(10) Patent No.: US 9,177,955 B2
(45) Date of Patent: Nov. 3, 2015

(54) ISOLATION REGION GAP FILL METHOD

(71) Applicant: Taiwan Semiconductor Manufacturing Company, Ltd., Hsin-Chu (TW)

(72) Inventors: Chih-Tang Peng, Zhubei (TW); Tai-Chung Huang, Hsin-Chu (TW); Hao-Ming Lien, Hsin-Chu (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/790,923

(22) Filed: Mar. 8, 2013

(65) Prior Publication Data

US 2014/0252497 A1 Sep. 11, 2014

(51) Int. Cl.
| | |
|---|---|
| *H01L 29/78* | (2006.01) |
| *H01L 27/088* | (2006.01) |
| *H01L 21/8238* | (2006.01) |
| *H01L 27/108* | (2006.01) |
| *H01L 21/762* | (2006.01) |
| *H01L 21/8234* | (2006.01) |

(52) U.S. Cl.
CPC ...... *H01L 27/0886* (2013.01); *H01L 21/76224* (2013.01); *H01L 21/823431* (2013.01); *H01L 21/823821* (2013.01); *H01L 27/10879* (2013.01); *H01L 29/7831* (2013.01)

(58) Field of Classification Search
CPC ............... H01L 21/823431; H01L 21/823821; H01L 27/10879; H01L 29/7831
USPC ..................... 438/294; 257/E29.132, E29.135
See application file for complete search history.

(56) References Cited

U.S. PATENT DOCUMENTS

| | | | |
|---|---|---|---|
| 2011/0121406 A1 | 5/2011 | Lee et al. | |
| 2013/0217204 A1* | 8/2013 | Park | 438/424 |

FOREIGN PATENT DOCUMENTS

| | | |
|---|---|---|
| KR | 1020030093384 A | 12/2003 |
| KR | 20110049806 A | 5/2011 |
| KR | 20110056225 A | 5/2011 |
| WO | 2010011287 A1 | 1/2010 |

* cited by examiner

*Primary Examiner* — Amar Movva
(74) *Attorney, Agent, or Firm* — Slater & Matsil, L.L.P.

(57) ABSTRACT

An isolation region gap fill method comprises depositing a first dielectric material over a semiconductor device through a flowable deposition process or other gap fill deposition processes, wherein the semiconductor device includes a first FinFET comprising a plurality of first fins and a second FinFET comprising a plurality of second fins. The method further comprises removing the first dielectric material between the first FinFET and the second FinFET to form an inter-device gap, depositing a second dielectric material into the inter-device gap and applying an annealing process to the semiconductor device.

13 Claims, 7 Drawing Sheets

ISOLATION REGION GAP FILL METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

The formation of fins of a FinFET may include recessing a substrate to form recesses, filling the recesses with a dielectric material, performing a chemical mechanical polish process to remove excess portions of the dielectric material above the fins, and recessing a top layer of the dielectric material, so that the remaining portions of the dielectric material in the recesses form shallow trench isolation (STI) regions.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a method for forming intra-device isolation regions and inter-device isolation regions in a FinFET semiconductor device. The invention may also be applied, however, to a variety of semiconductor devices. Hereinafter, various embodiments will be explained in detail with reference to the accompanying drawings.

Figure 1:
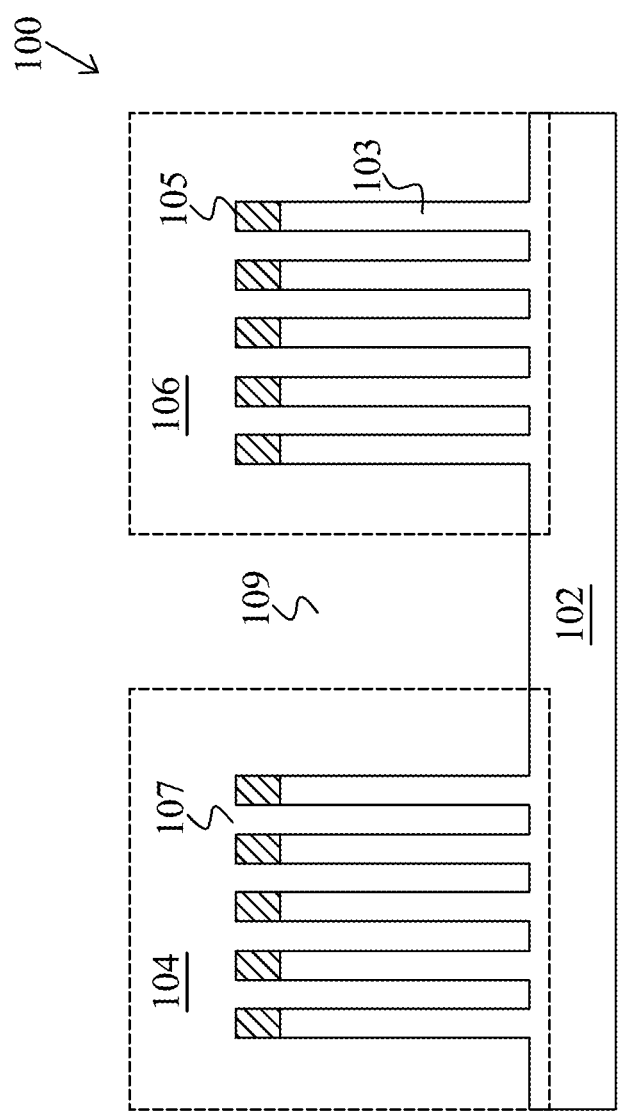
FIG. 1 illustrates a cross sectional view of a semiconductor device including two FinFETs in accordance with various embodiments of the present disclosure.

FIG. 1 illustrates a cross sectional view of a semiconductor device including two FinFETs in accordance with various embodiments of the present disclosure. The semiconductor device 100 includes a first FinFET 104 and a second FinFET 106. Both the first FinFET 104 and the second FinFET 106 are formed over a substrate 102.

The substrate 102 may be formed of silicon. Other commonly used materials, such as carbon, germanium, gallium, arsenic, nitrogen, indium, and/or phosphorus, and the like, may also be included in the substrate 102. The substrate 102 may be a bulk substrate or a semiconductor-on-insulator (SOI) substrate.

As shown in FIG. 1, both the first FinFET 104 and the second FinFET 106 are formed by a plurality of fins (e.g., fin 103). In particular, the first FinFET 104 and the second FinFET 106 include five fins. Two adjacent fins are separated from each other by a gap. It should be noted that while FIG. 1 shows each FinFET includes five fins, this is merely an example. One skilled in the art will recognize there may be various modifications, alternatives and variations. For example, each FinFET may accommodate any number of fins depending on different applications and design needs.

As shown in FIG. 1, there may be a mask layer 105 formed over the fin 103. In some embodiments, the mask layer 105 may be formed of suitable dielectric materials such as silicon nitride and the like. The mask layer 105 may be formed through deposition techniques such as low-pressure chemical vapor deposition (LPCVD). Alternatively, the mask layer 105 may be formed by plasma enhanced chemical vapor deposition (PECVD). The mask layer 105 may be used as a hard mask during subsequent photolithography processes.

It should be noted that there may be an adhesion layer formed between the mask layer 105 and the fin 103. The adhesion layer (not shown) may be a thin film comprising silicon. The adhesion layer may be formed by using a thermal oxidation process.

The semiconductor device 100 may comprise two types of gaps. A first gap 107 is located between two adjacent fins. Throughout the description, the first gap 107 is alternatively referred to as an intra-device gap. A second gap 109 is located between two adjacent FinFETs. Throughout the description, the second gap 109 is alternatively referred to as an inter-device gap. The gaps (e.g., the first gap 107) between fins of the FinFETs will be filled with a first dielectric material to form intra-device isolation regions during the subsequent fabrication steps. Likewise, the gap (e.g., the second gap 109) between two FinFETs will be filled with a second dielectric material to form an inter-device isolation region. The detailed formation process of the intra-device isolations and the inter-device isolation region will be described in detail below with respect to FIGS. 2-7.

Figure 2:
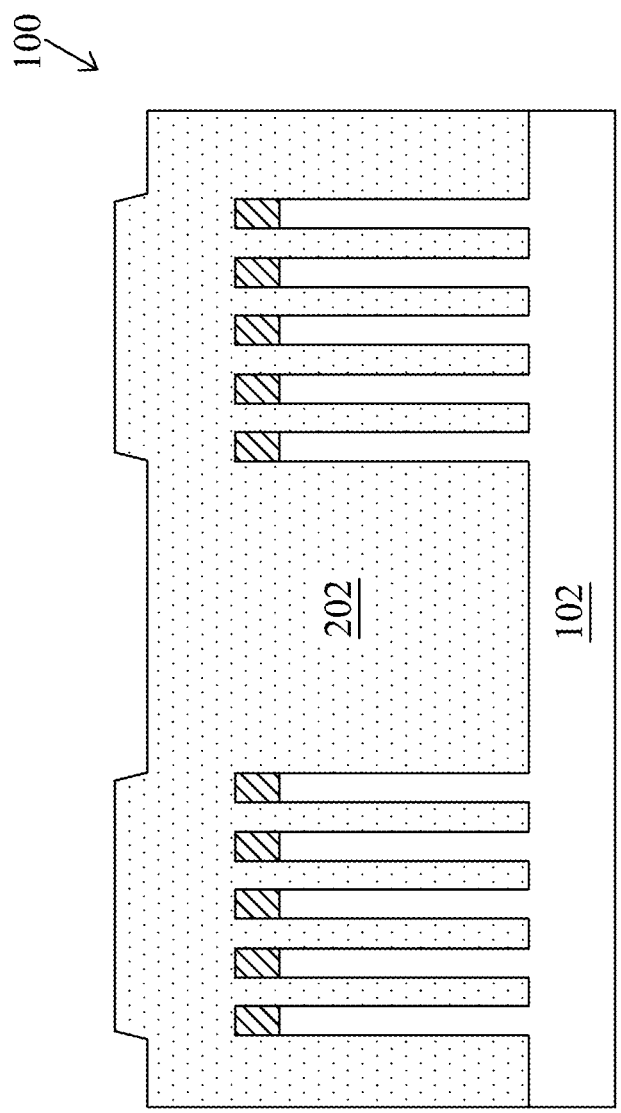
FIG. 2 illustrates a cross sectional view of the semiconductor device shown in FIG. 1 after a flowable chemical vapor deposition (FCVD) process is applied to the semiconductor device in accordance with various embodiments of the present disclosure.

FIG. 2 illustrates a cross sectional view of the semiconductor device shown in FIG. 1 after a flowable chemical vapor deposition (FCVD) process is applied to the semiconductor device in accordance with various embodiments of the present disclosure. A FCVD process is employed to fill both the intra-device gaps and the inter-device gap. During the FCVD process, a soft liquid-like film 202 flows into the intra-device gaps between the fins as well as the inter-device gap between the FinFETs. As a result, a void-free fill can be achieved through the FCVD process.

In accordance with some embodiments, the soft liquid-like film 202 may comprise a combination of silicon oxide and silicon nitride. One advantageous feature of having the FCVD process is that the soft liquid-like film can fill high aspect ratio gaps between the fins shown in FIG. 2. As a result, some fabrication failures such as fin deformation and the like may be avoided.

It should be noted that while a FCVD process is employed as an example, the gaps may be filled by other suitable gap fill deposition processes.

Figure 3:
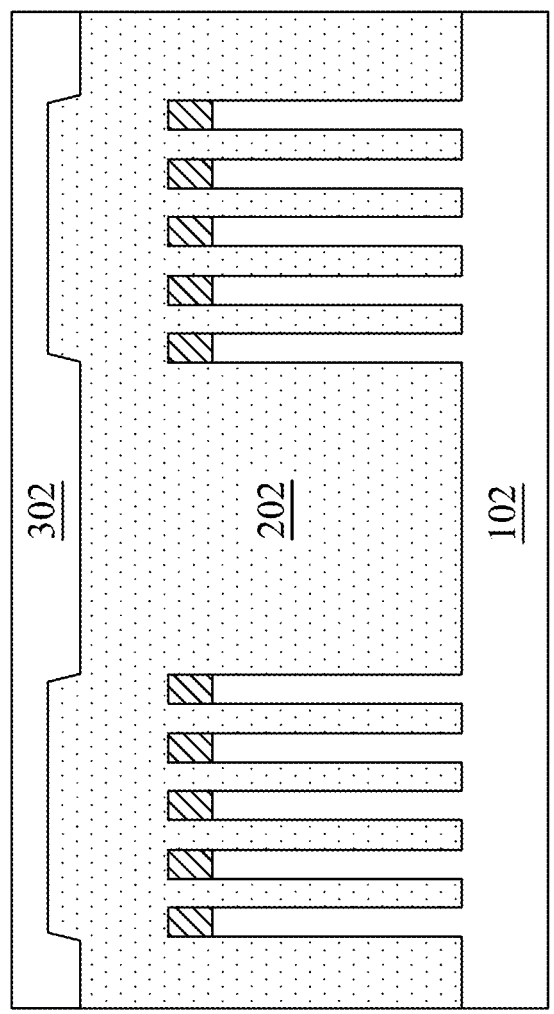
FIG. 3 illustrates a cross sectional view of the semiconductor device shown in FIG. 2 after a photoresist layer is deposited over the semiconductor device in accordance with various embodiments of the present disclosure.

FIG. 3 illustrates a cross sectional view of the semiconductor device shown in FIG. 2 after a photoresist layer is deposited over the semiconductor device in accordance with various embodiments of the present disclosure. The photoresist layer 302 is deposited over the semiconductor device 100. The photoresist layer 302 is formed of suitable photoresist materials such as polybenzoxazole (PBO), SU-8 photo-sensitive epoxy, film type polymer materials and/or the like. The photoresist layer 302 may be formed by suitable fabrication techniques such as spin coating and/or the like.

Figure 4:
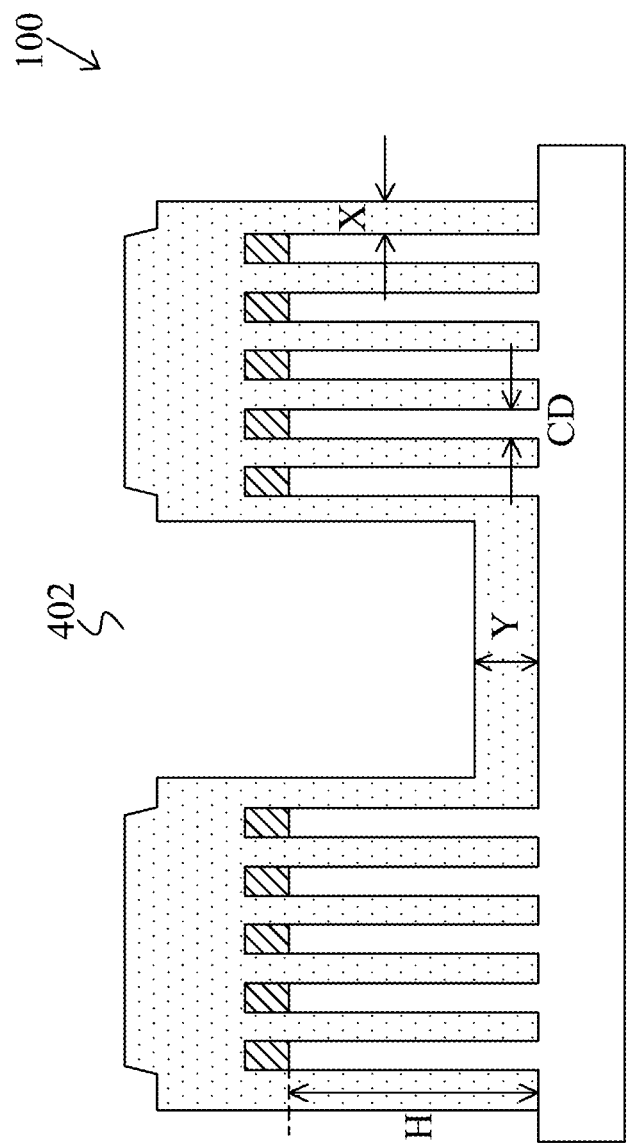
FIG. 4 illustrates a cross sectional view of the semiconductor device shown in FIG. 3 after a patterning process and an etching process are applied to the semiconductor device in accordance with various embodiments of the present disclosure.

FIG. 4 illustrates a cross sectional view of the semiconductor device shown in FIG. 3 after a patterning process and an etching process are applied to the semiconductor device in accordance with various embodiments of the present disclosure. An opening 402 may be formed by using suitable techniques including photolithography and etching processes. In particular, the photolithography and etching processes may comprise exposing the photoresist material to a pattern, etching the semiconductor device 100 in accordance with the pattern. In this manner, the opening 402 may be formed as a result.

The etching process is so controlled that the remaining dielectric material in the inter-device gap is of a thickness Y. In some embodiments, Y is less than the height of the fins, which is defined as H as shown in FIG. 4. In addition, the width of the fins is defined as CD. The thickness of the remaining dielectric material adjacent to the rightmost fin is defined as X. In some embodiments, X is in a range from about 0 to about 20 times CD.

Figure 5:
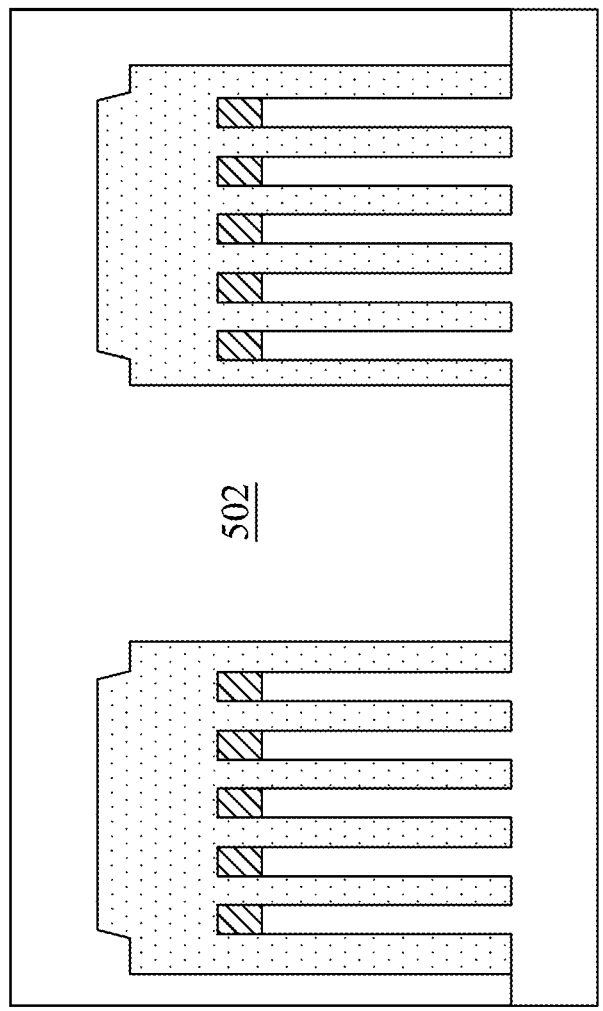
FIG. 5 illustrates a cross sectional view of the semiconductor device shown in FIG. 4 after a deposition process is applied to the semiconductor device in accordance with various embodiments of the present disclosure.

FIG. 5 illustrates a cross sectional view of the semiconductor device shown in FIG. 4 after a deposition process is applied to the semiconductor device in accordance with various embodiments of the present disclosure. The openings are then filled with dielectric materials to form an isolation region. In accordance with an embodiment, the isolation regions may be filled with a dielectric material such as an oxide material, a high-density plasma (HDP) oxide or the like. Alternatively, the dielectric material may be formed of materials selected from the group consisting of silicon oxide, silicon nitride, silicon carbon nitride, silicon oxy-carbon nitride and any combinations thereof.

In an exemplary embodiment, the dielectric material 502 may comprise silicon oxide, which may be formed of a chemical vapor deposition method (CVD) such as sub-atmospheric CVD (SACVD), high density plasma CVD (HDPCVD) and/or the like.

One advantageous feature of having the inter-device gap filled with an oxide material such as a HDP oxide and the like is that the HDP oxide can provide strong support for the adjacent FinFETs during the subsequent fabrication steps. Such strong support helps to reduce FinFET failures such as fin deformation and the like.

Figure 6:
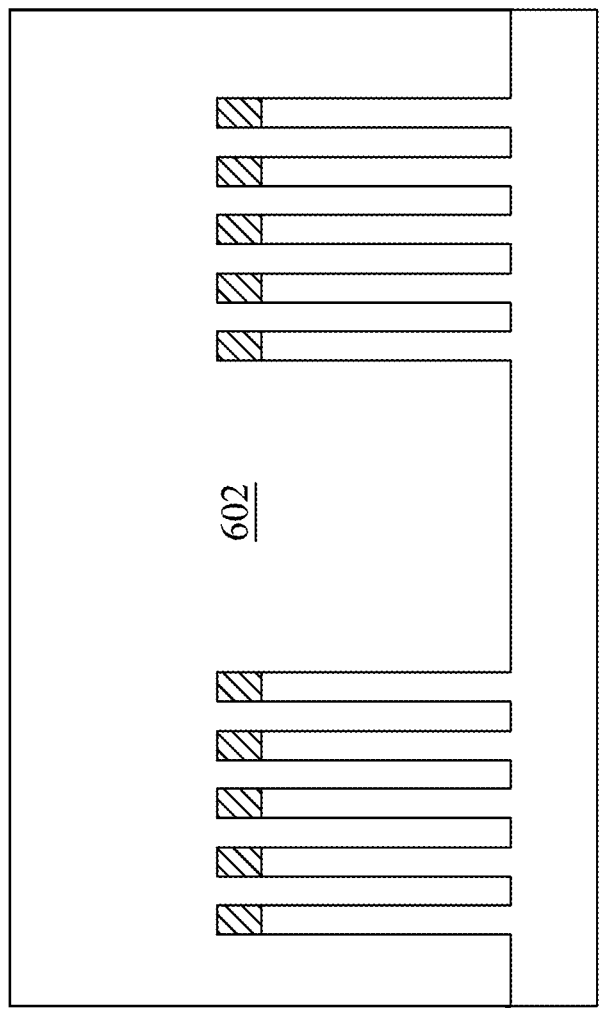
FIG. 6 illustrates a cross sectional view of the semiconductor device shown in FIG. 5 after a wet oxidation and an annealing process are applied to the semiconductor device in accordance with various embodiments of the present disclosure.

FIG. 6 illustrates a cross sectional view of the semiconductor device shown in FIG. 5 after a wet oxidation and an annealing process are applied to the semiconductor device in accordance with various embodiments of the present disclosure. Once the dielectric materials 502 (shown in FIG. 5) fill the inter-device gap, a wet oxidation process and an annealing process may be performed on the semiconductor device 100 to convert the soft liquid-like film at the intra-device gaps into a hard dielectric film. As such, the multilayer films shown in FIG. 5 are converted into a single layer film 602 with homogeneous composition.

In some embodiments, the wet oxidation process may be implemented as wet stream. The annealing process may be a plasma annealing process, a laser annealing process, a thermal annealing process, an ultraviolet annealing process and/or the like.

Figure 7:
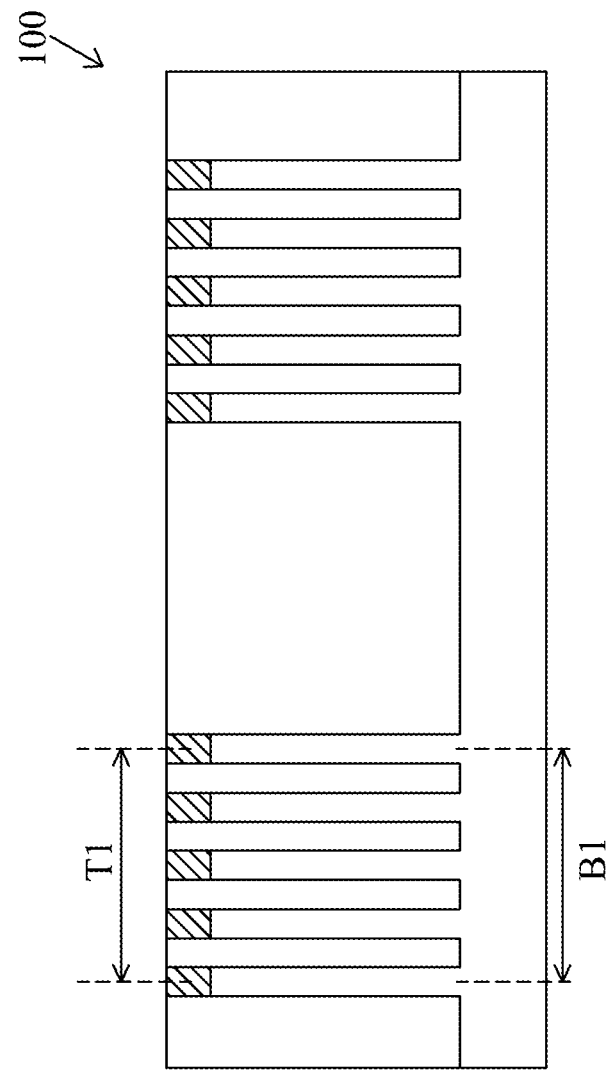
FIG. 7 illustrates a cross sectional view of the semiconductor device shown in FIG. 6 after a chemical mechanical polish (CMP) process is applied to the semiconductor device in accordance with various embodiments of the present disclosure.

FIG. 7 illustrates a cross sectional view of the semiconductor device shown in FIG. 6 after a chemical mechanical polish (CMP) process is applied to the semiconductor device in accordance with various embodiments of the present disclosure. The excess dielectric materials may be removed by using suitable techniques such as grinding, polishing and/or chemical etching, a combination of etching and grinding techniques.

In accordance with some embodiments, the removal process may be implemented by using a CMP process. In the CMP process, a combination of etching materials and abrading materials are put into contact with the backside of the substrate and a grinding pad (not shown) is used to grind away the excess materials until the top surfaces of the fins are exposed.

As shown in FIG. 7, a first distance T1 is measured from a centerline of the upper portion of the leftmost fin to a centerline of the upper portion of the rightmost fin. A second distance B1 is measured from a centerline of the bottom portion of the leftmost fin to a centerline of the bottom portion of the right most fin. In some embodiments, a ratio of the first distance T1 to the second distance B1 is in a range from about 98% to about 102%.

In accordance with an embodiment, a method comprises depositing a first dielectric material over a semiconductor device through a flowable deposition process or other gap fill deposition processes, wherein the semiconductor device includes a first FinFET comprising a plurality of first fins and a second FinFET comprising a plurality of second fins. The method further comprises removing the first dielectric material between the first FinFET and the second FinFET to form an inter-device gap, depositing a second dielectric material into the inter-device gap and applying an annealing process to the semiconductor device.

In accordance with an embodiment, a device comprises a first FinFET comprising a plurality of first fins, wherein a first distance measured from an upper portion of a leftmost fin to an upper portion of a rightmost fin is approximately equal to a second distance measured from a bottom portion of the leftmost fin to a bottom portion of the rightmost fin and a plurality of first intra-device isolation regions, wherein each first inter-device isolation region is located between two adjacent first fins.

In accordance with an embodiment, a method comprises forming a plurality of first fins and a plurality of second fins over a substrate, wherein two adjacent first fins are separated from each other by a first intra-device gap, two adjacent second fins are separated from each other by a second intra-device gap and the first fins and the second fins are separated by an inter-device gap. The method further comprises depositing a liquid-like film in the first intra-device gap, the second intra-device gap and the inter-device gap, removing the liquid-like film in the inter-device gap, depositing a dielectric material in the inter-device gap and performing an annealing process to harden the liquid-like film in the first intra-device gap, the second intra-device gap.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
depositing a first dielectric material over a semiconductor device through a flowable deposition process, wherein the semiconductor device includes:
   a first FinFET comprising a plurality of first fins; and
   a second FinFET comprising a plurality of second fins;
removing the first dielectric material between the first FinFET and the second FinFET to form an inter-device gap, wherein the first fins of the first FinFET and the second fins of the second FinFET are directly formed on a silicon substrate during the step of removing the first dielectric material between the first FinFET and the second FinFET;
depositing a second dielectric material into the inter-device gap; and
applying an annealing process to the semiconductor device.

2. The method of claim 1, further comprising:
depositing a photoresist layer over the semiconductor device;
patterning the photoresist layer; and
etching exposed portions of the first dielectric material to form the inter-device gap.

3. The method of claim 1, further comprising:
after the step of applying the annealing process to the semiconductor device, performing a chemical mechanical polish process on the semiconductor device until top surfaces of the first fins and the second fins are exposed.

4. The method of claim 1, wherein:
the flowable deposition process is a flowable chemical vapor deposition process.

5. The method of claim 1, further comprising:
depositing the second dielectric material into the inter-device gap through a spin coating process.

6. The method of claim 1, further comprising:
after the step of depositing the second dielectric material into the inter-device gap, applying a wet oxidation process to the semiconductor device.

7. A method comprising:
forming a plurality of first fins and a plurality of second fins over a substrate, wherein:
   two adjacent first fins are separated from each other by a first intra-device gap;
   two adjacent second fins are separated from each other by a second intra-device gap; and
   the first fins and the second fins are separated by an inter-device gap;
depositing a liquid-like film in the first intra-device gap, the second intra-device gap and the inter-device gap;
removing the liquid-like film in the inter-device gap;
depositing a dielectric material in the inter-device gap; and
performing an annealing process to harden the liquid-like film in the first intra-device gap and the second intra-device gap.

8. The method of claim 7, further comprising:
depositing a mask layer on top of the first fins and the second fins.

9. The method of claim 7, further comprising:
depositing the liquid-like film in the first intra-device gap, the second intra-device gap and the inter-device gap through a flowable chemical vapor deposition process.

10. The method of claim 7, further comprising:
depositing a photoresist layer over the inter-device gap;
patterning the photoresist layer; and
removing the liquid-like film in the inter-device gap through an etching process.

11. The method of claim 10, further comprising:
etching the liquid-like film in the inter-device gap until a thickness of the liquid-like film is less than a height of the first fins.

12. The method of claim 7, wherein:
the dielectric material is formed of materials selected from the group consisting of silicon oxide, silicon nitride, silicon carbon nitride, silicon oxy-carbon nitride and any combinations thereof.

13. The method of claim 7, further comprising:
depositing the dielectric material in the inter-device gap through a spin coating process.

* * * * *